(12) United States Patent
Cromity et al.

(10) Patent No.: US 7,512,907 B2
(45) Date of Patent: Mar. 31, 2009

(54) GENERATING RULES FOR NETS THAT CROSS PACKAGE BOUNDARIES

(75) Inventors: Jacqueline Denise Cromity, Rochester, MN (US); Kenneth Lee Christian, Poughkeepsie, NY (US); Jan Elizabeth Hoffman, Rochester, MN (US); Lawrence Wayne Wood, Hyde Park, NY (US); John William Zack, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 432 days.

(21) Appl. No.: 11/344,928

(22) Filed: Feb. 1, 2006

(65) Prior Publication Data

US 2007/0180422 A1 Aug. 2, 2007

(51) Int. Cl.
*G06F 17/50* (2006.01)
(52) U.S. Cl. ............................................. 716/1; 716/13
(58) Field of Classification Search ................... 716/13, 716/1
See application file for complete search history.

(56) References Cited

U.S. PATENT DOCUMENTS

| | | | | |
|---|---|---|---|---|
| 4,615,011 A | * | 9/1986 | Linsker | 716/13 |
| 4,831,543 A | * | 5/1989 | Mastellone | 716/2 |
| 6,957,408 B1 | * | 10/2005 | Teig et al. | 716/12 |
| 7,146,595 B2 | * | 12/2006 | Knol et al. | 716/11 |
| 2005/0049841 A1 | * | 3/2005 | Chen et al. | 703/14 |
| 2005/0050489 A1 | * | 3/2005 | Chen et al. | 716/4 |
| 2005/0246686 A1 | * | 11/2005 | Seshadri et al. | 717/117 |
| 2006/0195460 A1 | * | 8/2006 | Nori et al. | 707/100 |
| 2006/0248492 A1 | * | 11/2006 | Hetzel | 716/14 |
| 2007/0171223 A1 | * | 7/2007 | McArdle et al. | 345/420 |

* cited by examiner

*Primary Examiner*—Paul Dinh
*Assistant Examiner*—Suchin Parihar
(74) *Attorney, Agent, or Firm*—Owen J. Gamon

(57) ABSTRACT

In an embodiment, data models are stitched into a stitched data model, where each of the data models has nets and at least one of the nets crosses a package boundary. A subset of the nets from the stitched data model are selected based on a constraint, and the subset is stitched into a common rule. In various embodiments, the constraints may include a wire length, a name of the nets, and maximum numbers of vias or T-connections. If the nets are completely wired, then wire segments between nodes of the nets are connected and nodes that include non-branching vias are moved. If the nets are not completely wired, then for any of the nets that have an open connection, a rule is found with a same number of the nodes as the net with the open connection, and the nets are ordered based on the rule.

11 Claims, 12 Drawing Sheets

NET TABLE 180-1

| NODE | REFDES | LOW HIER | HIGH HIER | PACKAGE | TYPE | |
|---|---|---|---|---|---|---|
| NODE A | NODE1 | CARD B | CARD A | CARD A | P | 402 |
| NODE B | NODE2 | CONN | CONN | CARD A | P | 404 |
| NODE C | NODE3 | CONN | CONN | CARD B | P | 406 |
| NODE D | NODE4 |  | CARD B | CARD B | P | 408 |
| NODE E | NODE5 |  | CARD B | CARD B | P | 410 |
| NODE F | NODE6 | CONN | CONN | CARD B | P | 412 |
| NODE G | NODE7 | CONN | CONN | CARD C | P | 414 |
| NODE H | NODE8 | CARD C | CARD C | CARD C | P | 416 |
| NODE I | NODE9 | CONN | CONN | CARD C | P | 418 |
| NODE J | NODE10 | CONN | CONN | CARD C | P | 420 |
| NODE K | NODE11 | CARD B | CARD C | CARD B | P | 422 |
| NODE L | NODE12 |  | CARD B | CARD B | P | 424 |

Column headers labeled: 426, 428, 430, 432, 434, 436

FIG. 6A

| | | | NET TABLE | | | | |
|---|---|---|---|---|---|---|---|
| WIRE SEG (472) | LOW HIER (430) | HIGH HIER (432) | MIN LENGTH (433) | PACKAGE (434) | NETNAME (438) | PIN NAME (440) | |
| SYSTEM NET | | | | | SYSTEM NET A | | 449 |
| CONN A B | | CARD A | 60.2 | CARD A | X1 | P1 | 450 |
| CONN B C | CARD B | CARD C | 30.2 | CONN | X2 | P2 | 452 |
| CONN C D | CARD B | CARD C | 60.2 | CARD B | X3 | P3 | 454 |
| CONN D E | CARD B | CARD C | 55 | CARD B | X4 | P4 | 456 |
| CONN E F | CONN | CONN | 54 | CARD B | X5 | P5 | 458 |
| CONN F G | CONN | CONN | 53.5 | CONN | X6 | P6 | 460 |
| CONN G H | CONN | CONN | 45.7 | CARD C | X7 | P7 | 462 |
| CONN H I | CARD B | CARD C | 42.6 | CARD C | X8 | P8 | 464 |
| CONN I J | CONN | CONN | 43.2 | CARD C | X9 | P9 | 466 |
| CONN J K | CONN | CONN | 41.7 | CONN | X10 | P10 | 468 |
| CONN K L | CARD B | CARD C | 46.2 | CARD B | X11 | P11 | 470 |

FIG. 6B

GENERATING RULES FOR NETS THAT CROSS PACKAGE BOUNDARIES

FIELD

This invention generally relates to circuit design tools and more specifically relates to generating rules for nets in a circuit.

BACKGROUND

The development of the EDVAC computer system of 1948 is often cited as the beginning of the computer era. Since that time, computer systems have evolved into extremely sophisticated devices, and computer systems may be found in many different settings. Computer systems typically include a combination of hardware (such as semiconductors, integrated circuits, programmable logic devices, programmable gate arrays, and circuit boards) and software, also known as computer programs.

The design of circuits is complicated due to the high speed performance requirements typical of computer system hardware. In order to meet these requirements, analysis of the circuit design is necessary prior to building hardware, in order to ensure proper high-speed propagation and performance. This early analysis of the design facilitates early design trade-offs that ultimately reduce the development cycle time of the product that includes the circuit and the number of versions of the hardware that are necessary to meet product requirements. Topology checking tools are used during the early analysis to help determine proper length, placement, and routing of the high speed signals used in the circuit to meet performance requirements. Such tools involve placing constraints on the topology of signal nets and then checking these constraints during physical design. This process requires users to write topology rules describing signal design and interconnects across boundaries of packages on which the circuit is located.

For a circuit that has signaling across multiple package boundaries, a user must write rules for each package that the signals cross. In a typical system, this involves manually writing topology rules and then managing the checking of these constraints on each package for each signal, which is cumbersome and quickly becomes impossible for a system that has thousands of nets across multiple packages.

What is needed is a technique that generates topology rules and handles system level nets across package boundaries.

SUMMARY

A method, apparatus, system, processor, and signal-bearing medium are provided. In an embodiment, data models are stitched into a stitched data model, where each of the data models has nets and at least one of the nets crosses a package boundary. A subset of the nets from the stitched data model are selected based on a constraint, and the subset is stitched into a common rule. In various embodiments, the constraints may include a wire length, a name of the nets, and maximum numbers of vias or T-connections. If the nets are completely wired, then wire segments between nodes of the nets are connected and nodes that include non-branching vias are moved. If the nets are not completely wired, then for any of the nets that have an open connection, a rule is found with a same number of the nodes as the net with the open connection, and the nets are ordered based on the rule.

BRIEF DESCRIPTION OF THE DRAWINGS

Various embodiments of the present invention are hereinafter described in conjunction with the appended drawings:

FIG. 6A depicts a high-level block diagram of an example net table, according to an embodiment of the present invention.

FIG. 6B depicts a high-level block diagram of an example net table, according to an embodiment of the present invention.

It is to be noted, however, that the appended drawings illustrate only example embodiments of the invention, and are therefore not considered limiting of its scope, for the invention may admit to other equally effective embodiments.

DETAILED DESCRIPTION

In an embodiment, a rule data engine stitches data models together into a stitched data model and produces a net table based on a configuration file and the stitched data model. The net table specifies a subset of the nets from the stitched data model that are selected and formatted based on the configuration file. The configuration file includes user-specified constraints that enable the net table to be programmable. A rule generator stitches nets specified in the net table and/or the rule files into a common rule in the net rules based on attributes in the net table. The rule files are preexisting rules formatted based on a specific topology checking tool. The rule generator further creates system level topology rules in the net rules using attributes from the net table. The topology checking tool checks system level topology rules in the net rules against the stitched data model and reports which nets specified in the system level topology rules failed to match the rule files, which nets matched the rule files, and the attributes of the nets that matched.

Figure 1:
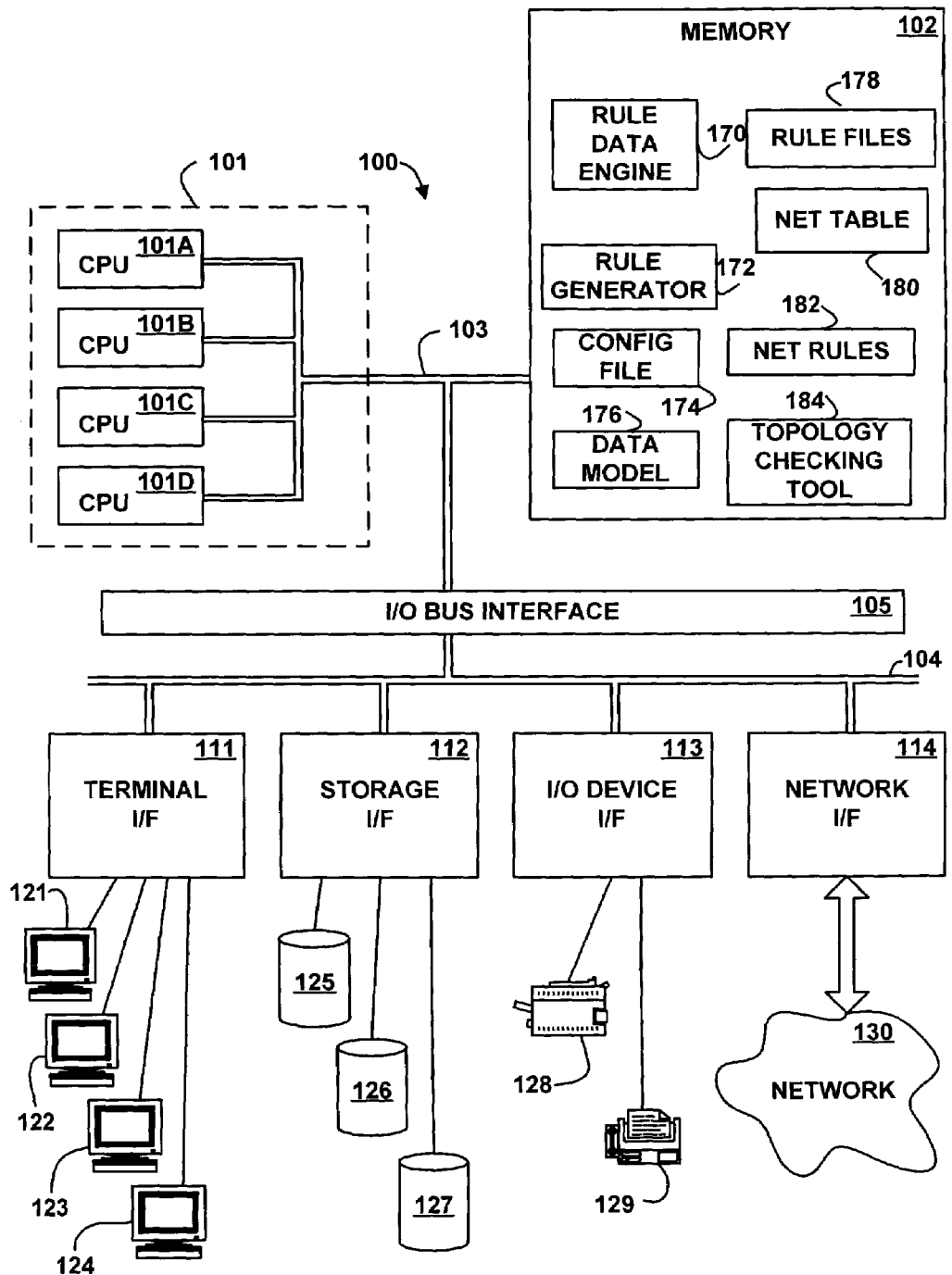
FIG. 1 depicts a high-level block diagram of a computer system, according to an embodiment of the present invention.

Referring to the Drawings, wherein like numbers denote like parts throughout the several views, FIG. 1 depicts a high-level block diagram representation of a computer system 100 connected to a network 130, according to an embodiment of the present invention. The major components of the computer system 100 include one or more processors 101, a main memory 102, a terminal interface 111, a storage interface 112, an I/O (Input/Output) device interface 113, and communications/network interfaces 114, all of which are coupled for inter-component communication via a memory bus 103, an I/O bus 104, and an I/O bus interface unit 105.

The computer system 100 contains one or more general-purpose programmable central processing units (CPUs) 101A, 101B, 101C, and 101D, herein generically referred to as a processor 101. In an embodiment, the computer system 100 contains multiple processors typical of a relatively large system; however, in another embodiment the computer system 100 may alternatively be a single CPU system. Each processor 101 executes instructions stored in the main memory 102 and may include one or more levels of on-board cache.

The main memory 102 is a random-access semiconductor memory for storing data and programs. The main memory 102 is conceptually a single monolithic entity, but in other embodiments the main memory 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may further be distributed and associated with different CPUs or sets of CPUs, as is known in any of various so-called non-uniform memory access (NUMA) computer architectures.

The memory 102 includes a rule data engine 170, a rule generator 172, a configuration file 174, a data model 176, rule files 178, a net table 180, net rules 182, and a topology checking tool 184. Although the rule data engine 170, the rule generator 172, the configuration file 174, the data model 176, the rule files 178, the net table 180, the net rules 182, and the topology checking tool 184 are illustrated as being contained within the memory 102 in the computer system 100, in other embodiments some or all of them may be on different computer systems and may be accessed remotely, e.g., via the network 130. The computer system 100 may use virtual addressing mechanisms that allow the programs of the computer system 100 to behave as if they only have access to a large, single storage entity instead of access to multiple, smaller storage entities. Thus, while the rule data engine 170, the rule generator 172, the configuration file 174, the data model 176, the rule files 178, the net table 180, the net rules 182, and the topology checking tool 184 are illustrated as being contained within the main memory 102, these elements are not necessarily all completely contained in the same storage device at the same time.

The rule data engine 170 stitches data models 176 together into a stitched data model 176 and produces the net table 180 based on the configuration file 174 and the stitched data model 176. The net table 180 specifies a subset of the nets from the stitched data model 176 that are selected and formatted based on the configuration file 174. The configuration file 174 includes user-specified content that enables the net table 180 to be programmable. The rule generator 172 stitches nets specified in the net table 180 and/or the legacy rule files 178 into system level rules that describe the connectivity in the net rules 182 based on attributes in the net table 180. The rule files 178 are preexisting rules formatted based on a specific topology checking tool 184. The rule generator 172 further creates system level topology rules in the net rules 182 using attributes from the net table 180. The topology checking tool 184 checks system level topology rules in the net rules 182 against the stitched data model 176 and reports which nets specified in the system level topology rules failed to match the rule files 178, which nets matched the rule files 178, and the attributes of the nets that matched.

The configuration file 174, the data model 176, the rule file 178, and/or the net table 180 may be implemented via fields, keywords, records, entries, statements, control codes, logic, or any combination or portion thereof. The data model 176 is further described below with reference to FIG. 3. The configuration file 174 is further described below with reference to FIG. 4. The rule file 178 is further described below with reference to FIG. 5. The net table 180 is further described below with reference to FIGS. 6A and 6B. The net rules 182 are further described below with reference to FIG. 7.

In an embodiment, the rule data engine 170, the rule generator 172, and the topology checking tool 184 include instructions capable of executing on the processor 101 or statements capable of being interpreted by instructions executing on the processor 101 to perform the functions as further described below with reference to FIGS. 8, 9, 10, and/or 11. In another embodiment, the rule data engine 170, the rule generator 172, and the topology checking tool 184, or any portion or combination thereof, may be implemented in microcode. In another embodiment, the rule data engine 170, the rule generator 172, and the topology checking tool 184, or any portion or combination thereof, may be implemented in hardware via logic gates and/or other appropriate hardware techniques.

The memory bus 103 provides a data communication path for transferring data among the processor 101, the main memory 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The system I/O bus 104 may be, e.g., an industry standard PCI bus, or any other appropriate bus technology.

The I/O interface units support communication with a variety of storage and I/O devices. For example, the terminal interface unit 111 supports the attachment of one or more user terminals 121, 122, 123, and 124. The storage interface unit 112 supports the attachment of one or more direct access storage devices (DASD) 125, 126, and 127 (which are typically rotating magnetic disk drive storage devices, although they could alternatively be other devices, including arrays of disk drives configured to appear as a single large storage device to a host). The contents of the main memory 102 may be stored to and retrieved from the direct access storage devices 125, 126, and 127.

The I/O device interface 113 provides an interface to any of various other input/output devices or devices of other types. Two such devices, the printer 128 and the fax machine 129, are shown in the exemplary embodiment of FIG. 1, but in other embodiment many other such devices may exist, which may be of differing types. The network interface 114 provides one or more communications paths from the computer system 100 to other digital devices and computer systems; such paths may include, e.g., one or more networks 130.

Although the memory bus 103 is shown in FIG. 1 as a relatively simple, single bus structure providing a direct communication path among the processors 101, the main memory 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, etc. Furthermore, while the I/O bus interface 105 and the I/O bus 104 are shown as single respective units, the computer system 100 may in fact contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

The computer system 100 depicted in FIG. 1 has multiple attached terminals 121, 122, 123, and 124, such as might be typical of a multi-user "mainframe" computer system. Typically, in such a case the actual number of attached devices is greater than those shown in FIG. 1, although the present invention is not limited to systems of any particular size. The computer system 100 may alternatively be a single-user system, typically containing only a single user display and keyboard input, or might be a server or similar device which has little or no direct user interface, but receives requests from other computer systems (clients). In other embodiments, the computer system 100 may be implemented as a personal computer, portable computer, laptop or notebook computer, PDA (Personal Digital Assistant), tablet computer, pocket computer, telephone, pager, automobile, teleconferencing system, appliance, or any other appropriate type of electronic device.

The network 130 may be any suitable network or combination of networks and may support any appropriate protocol suitable for communication of data and/or code to/from the computer system 100. In various embodiments, the network 130 may represent a storage device or a combination of storage devices, either connected directly or indirectly to the computer system 100. In an embodiment, the network 130 may support Infiniband. In another embodiment, the network 130 may support wireless communications. In another embodiment, the network 130 may support hard-wired communications, such as a telephone line or cable. In another embodiment, the network 130 may support the Ethernet IEEE (Institute of Electrical and Electronics Engineers) 802.3x specification. In another embodiment, the network 130 may be the Internet and may support IP (Internet Protocol). In another embodiment, the network 130 may be a local area network (LAN) or a wide area network (WAN). In another embodiment, the network 130 may be a hotspot service provider network. In another embodiment, the network 130 may be an intranet. In another embodiment, the network 130 may be a GPRS (General Packet Radio Service) network. In another embodiment, the network 130 may be a FRS (Family Radio Service) network. In another embodiment, the network 130 may be any appropriate cellular data network or cell-based radio network technology. In another embodiment, the network 130 may be an IEEE 802.11B wireless network. In still another embodiment, the network 130 may be any suitable network or combination of networks. Although one network 130 is shown, in other embodiments any number (including zero) of networks (of the same or different types) may be present.

It should be understood that FIG. 1 is intended to depict the representative major components of the computer system 100 at a high level, that individual components may have greater complexity than represented in FIG. 1, that components other than or in addition to those shown in FIG. 1 may be present, and that the number, type, and configuration of such components may vary. Several particular examples of such additional complexity or additional variations are disclosed herein; it being understood that these are by way of example only and are not necessarily the only such variations.

The various software components illustrated in FIG. 1 and implementing various embodiments of the invention may be implemented in a number of manners, including using various computer software applications, routines, components, programs, objects, modules, data structures, etc., referred to hereinafter as "computer programs," or simply "programs." The computer programs typically comprise one or more instructions that are resident at various times in various memory and storage devices in the computer system 100, and that, when read and executed by one or more processors 101 in the computer system 100, cause the computer system 100 to perform the steps necessary to execute steps or elements comprising the various aspects of an embodiment of the invention.

Moreover, while embodiments of the invention have and hereinafter will be described in the context of fully functioning computer systems, the various embodiments of the invention are capable of being distributed as a program product in a variety of forms, and the invention applies equally regardless of the particular type of signal-bearing medium used to actually carry out the distribution. The programs defining the functions of this embodiment may be delivered to the computer system 100 via a variety of signal-bearing media, which include, but are not limited to:

(1) information permanently stored on a non-rewriteable storage medium, e.g., a read-only memory device attached to or within a computer system, such as a CD-ROM, DVD-R, or DVD+R;

(2) alterable information stored on a rewriteable storage medium, e.g., a hard disk drive (e.g., the DASD 125, 126, or 127), CD-RW, DVD-RW, DVD+RW, DVD-RAM, or diskette; or (3) information conveyed by a communications medium, such as through a computer or a telephone network, e.g., the network 130.

Such tangible signal-bearing media, when carrying computer-readable instructions that direct the functions of the present invention, represent embodiments of the present invention.

Embodiments of the present invention may also be delivered as part of a service engagement with a client corporation, nonprofit organization, government entity, internal organizational structure, or the like. Aspects of these embodiments may include configuring a computer system to perform, and deploying software systems and web services that implement, some or all of the methods described herein. Aspects of these embodiments may also include analyzing the client company, creating recommendations responsive to the analysis, generating software to implement portions of the recommendations, integrating the software into existing processes and infrastructure, metering use of the methods and systems described herein, allocating expenses to users, and billing users for their use of these methods and systems. In addition, various programs described hereinafter may be identified based upon the application for which they are implemented in a specific embodiment of the invention. But, any particular program nomenclature that follows is used merely for convenience, and thus embodiments of the invention should not be limited to use solely in any specific application identified and/or implied by such nomenclature.

The exemplary environments illustrated in FIG. 1 are not intended to limit the present invention. Indeed, other alternative hardware and/or software environments may be used without departing from the scope of the invention.

Figure 2:
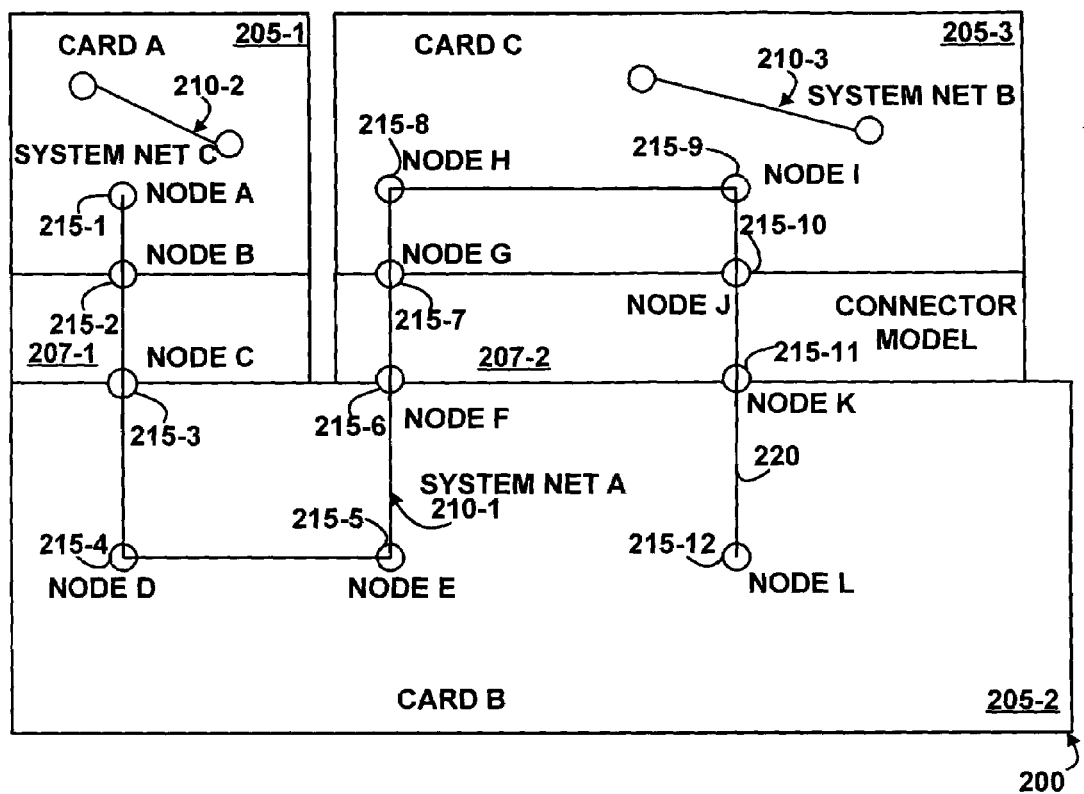
FIG. 2 depicts a high-level block diagram of a system configuration that is designed by an embodiment of the present invention.

FIG. 2 depicts a high-level block diagram of a system configuration 200 that is designed by an embodiment of the present invention. The system configuration 200 includes packages 205-1, 205-2, and 205-3, which in this example are cards, electronic circuit boards, MCMs (Multi-Chip Modules), or SCMs (Single Chip Modules). The system configuration 200 further includes connector models 207-1 and 207-2, which are electrical conductive material. The connector model 207-1 is disposed between the package 205-1 and the package 205-2, and the connector model 207-2 is disposed between the package 205-3 and 205-2.

The system configuration 200 further includes system nets, such as the example system nets 210-1, 210-2, and 210-3. The system nets are composed of nodes and wire segments between the nodes. For example, the system net 210-1 includes node A 215-1, node B 215-2, node C 215-3, node D 215-4, node E 215-5, node F 215-6, node G 215-7, node H 215-8, node I 215-9, node J 215-10, node K 215-11, and node L 215-12. In various embodiments, the nodes may be implemented, e.g., by vias, pins, or T-connections. A pin is a conducting contact of an electrical connector. A via is a conducting pathway between two or more layers or substrates of the packages 205-1, 205-2, and 205-3. A T-connection is a node that connects three wire segments. The wire segments between the nodes may be wires or other conductive material. An example of a wire segment between the nodes 215-11 and 215-12 is the wire segment 220.

In an embodiment, a system net may be located on multiple packages and thus may cross package boundaries. For example, the system net 210-1 is located on all of the packages 205-1, 205-2, and 205-3.

Figure 3:
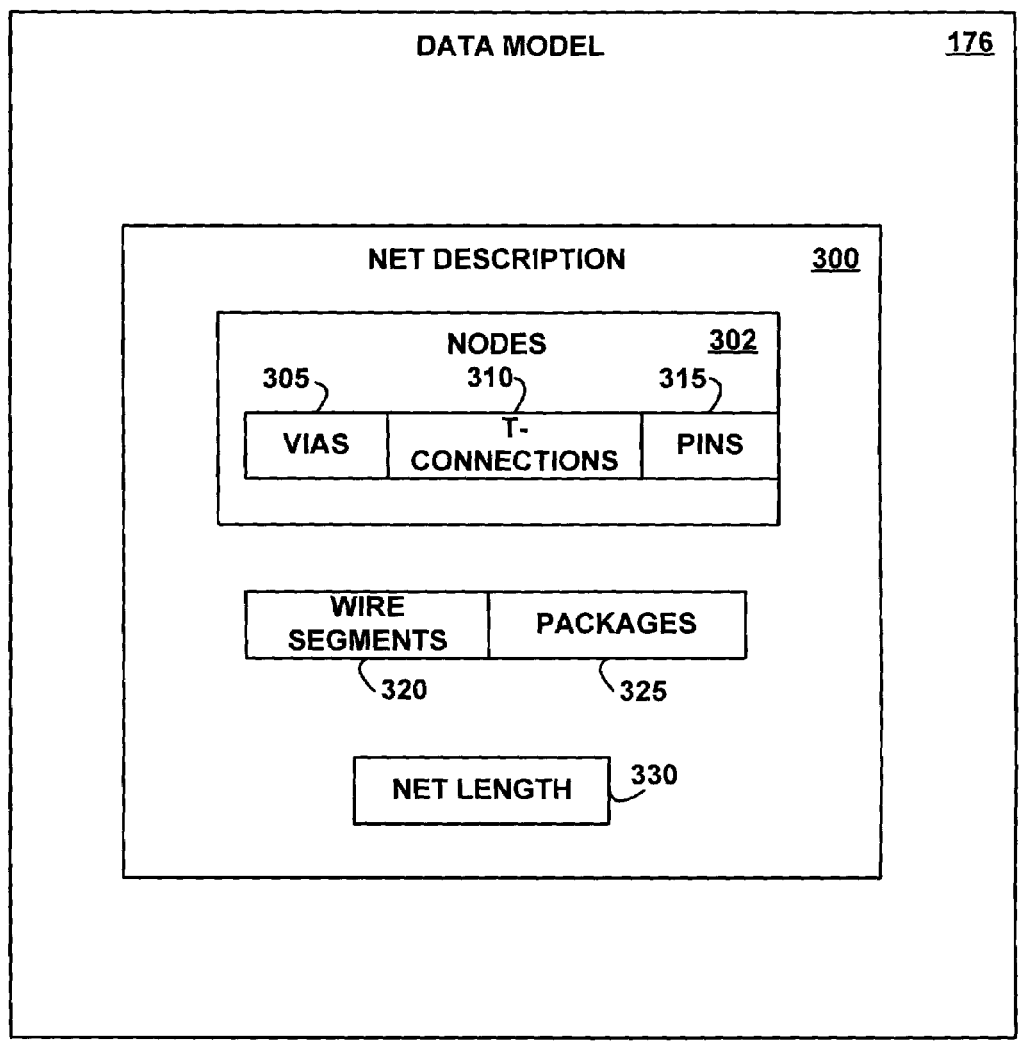
FIG. 3 depicts a high-level block diagram of an example data model, according to an embodiment of the present invention.

FIG. 3 depicts a high-level block diagram of an example data model 176, according to an embodiment of the present invention. The data model 176 describes, via the net description 300, the physical design of the system configuration 200. The data model 176 includes a net description 300, which includes a node description 302, wire segment descriptions 320, package descriptions 325, and a net length 330. The nodes description 302 may include vias descriptions 305, T-connections descriptions 310, and pin descriptions 315.

A data model 176 is present for each package 205-1, 205-2, and 205-3 that is included in the system configuration 200. The nodes of the system configuration 200 (e.g., the nodes 215-1, 215-2, 215-3, 215-4, 215-5, 215-6, 215-7, 215-8, 215-9, 215-10, 215-11, and 215-12) may be implemented by vias 305, T-connections 310, pins 315, or any portion or combination thereof. The via descriptions 305 identify conducting pathways between two or more layers or substrates of the packages 205-1, 205-2, and 205-3. The T-connections 310 describe conducting pathways that connect three of the wire segments 320. The package descriptions 325 identify, e.g., the packages 205-1, 205-2, and 205-3. The combination of the vias 305, the T-connections 310, the pins 315, the wire segments 320, and the packages 325 define the nets 300 of the system configuration 200, such as the system nets 210-1, 210-2, and 210-3 (FIG. 2). The net length 330 is the length of the net (the total length of all the wire segments 320 that make up the net), such as the length of the nets 210-1, 210-2, or 210-3.

Figure 4:
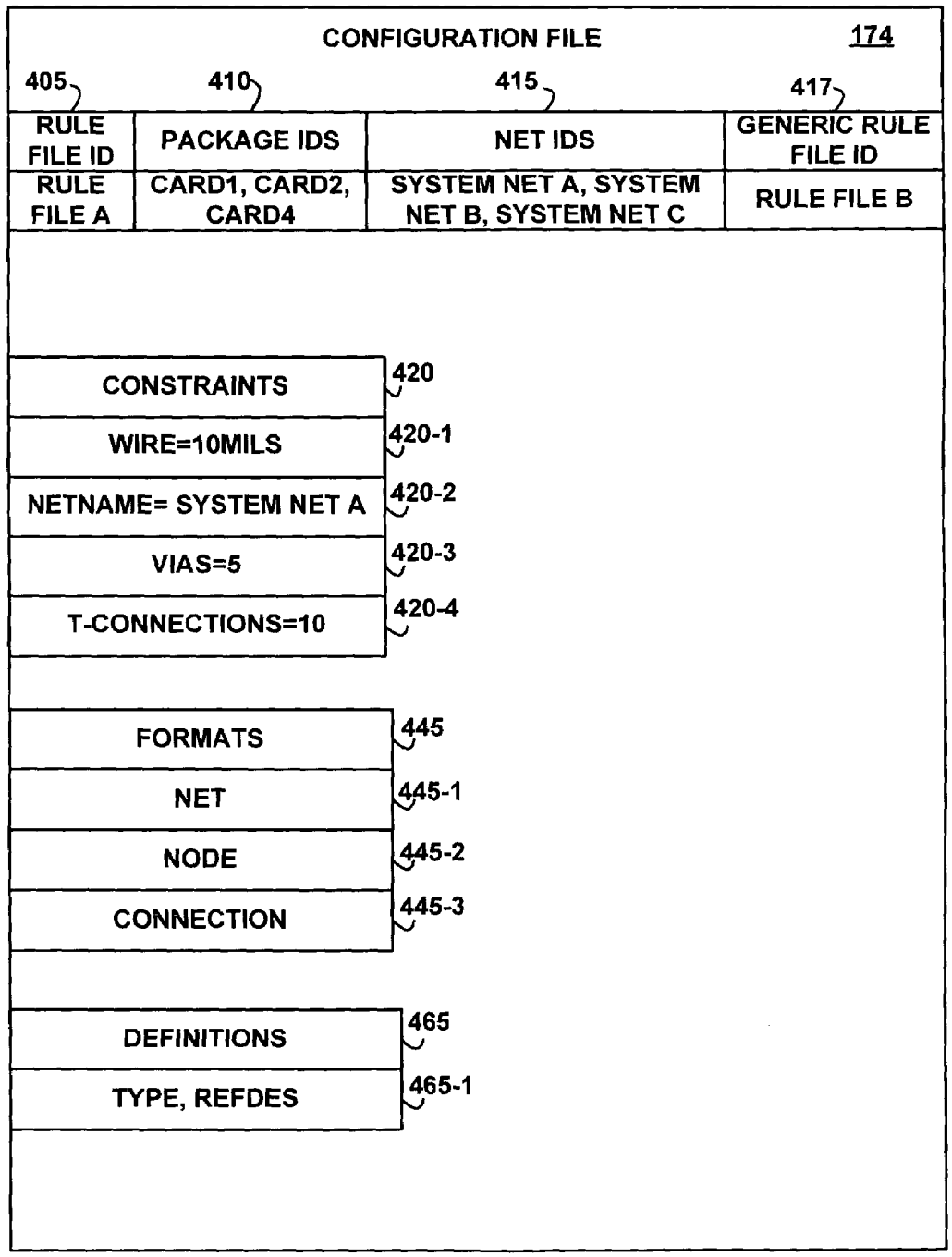
FIG. 4 depicts a high-level block diagram of an example configuration file, according to an embodiment of the present invention.

FIG. 4 depicts a high-level block diagram of an example configuration file 174, according to an embodiment of the present invention. The configuration file 174 includes a rule file identifier 405, package identifiers 410, net identifiers 415, a generic rule file identifier 417, constraints 420, formats 445, and definitions 465.

The rule file identifier 405 identifies the rule file 178 that the rule data engine 170 uses. The generic rule file identifier 417 identifies a rule file 178 that the rule data engine 170 optionally uses. The package identifiers 410 identify the packages, e.g., the cards 205-1, 205-2, and 205-3 in the system configuration 200. The net identifiers 415 identify the nets of the system configuration 200, e.g., the system nets 210-1, 210-2, and 210-3.

The constraints 420 include selection criteria that the rule data engine 170 uses to select a subset of the nets 300 from the data model 176, which the rule data engine 170 adds to the net table 180. Example constraints 420 include a wire length constraint 420-1, a net name constraint 420-2, a vias constraint 420-3, and a T-connections constraint 420-4, but in other embodiments any type and number of constraints may be present. The wire length constraint 420-1 specifies a length of a wire segment 320, and causes the rule data engine 170 to constrain the net table 180 to only include the subset of the nets 300 that have the specified wire length. The net name constraint 420-2 includes a name criteria of the net 300, and causes the rule data engine 170 to constrain the net table 180 to only include the subset of the nets 300 with the specified name or a name that includes or starts with specified characters. The vias constraint 420-3 includes a maximum number of vias, and causes the rule data engine 170 to constrain the net table 180 to only include a subset of the nets 300 up to (less than) the maximum number of vias. The T-connections constraint 420-4 includes a maximum number of T-connections, and causes the rule data engine 170 to constrain the net table 180 to only include a subset of the nets 300 up to (less than) a maximum number of T-connections.

The formats 445 indicate the column and row names of the attributes of the net table 180. Example formats 445 include a net format 445-1, a node format 445-2, and a connection format 445-3, but in other embodiments any appropriate type of formats 445 may be used. The net format 445-1 causes the rule data engine 170 to include a net name column in the net table 180, the node format 445-2 causes the rule data engine 170 to include a node column in the net table 180-1, and the connection format 445-3 causes the rule data engine 170 to include a wire segment column in the net table 180. The definitions 465 indicate a column heading with a meaning that is defined by the user. The example definitions 465-1 causes the rule data engine 170 to include a column entitled "refdes" in the net table 180.

In an embodiment, the default configuration file 174 has three default row heads of net 445-1, node 445-2, and connection 445-3 and a user defined formats 445, which allows the user to configure the system configuration 200, display the net table 180 in a concise manner, and view the net table 180. Consider an example where the user has a design specification stating that any net 300 that exceeds 4000 mil in length results in that net 300 running off of a card. The user wants to increase the net length 330 on the card 205-1 (FIG. 2) by 15%, but the user is unsure whether this increase will cause the length 330 of the net 300 to exceed 4000 mil and run off the card. In order to test the results of the increase in the net length 330, the user sets the wire length constraint 42001 to increase the length by 15% and executes the rule data engine 170, which generates the net table 180 that only includes nets that exceed 4000 mils, thus giving results at the system net level. The user can thus make design decision about the card 205-1 and determine effects of those design decisions on the entire system configuration 200. The user can also obtain information about the various packages 205-1, 205-2, and 205-3 without knowing the layout of any neighboring packages by setting the package identifiers 410 to cause the rule data engine 170 to select data from the data model 176 to include a particular package. The rule data engine 170 then reports package net data in the net table 180 using attributes from the data model 176 and the user-defined attributes in the configuration file 174.

Figure 5:
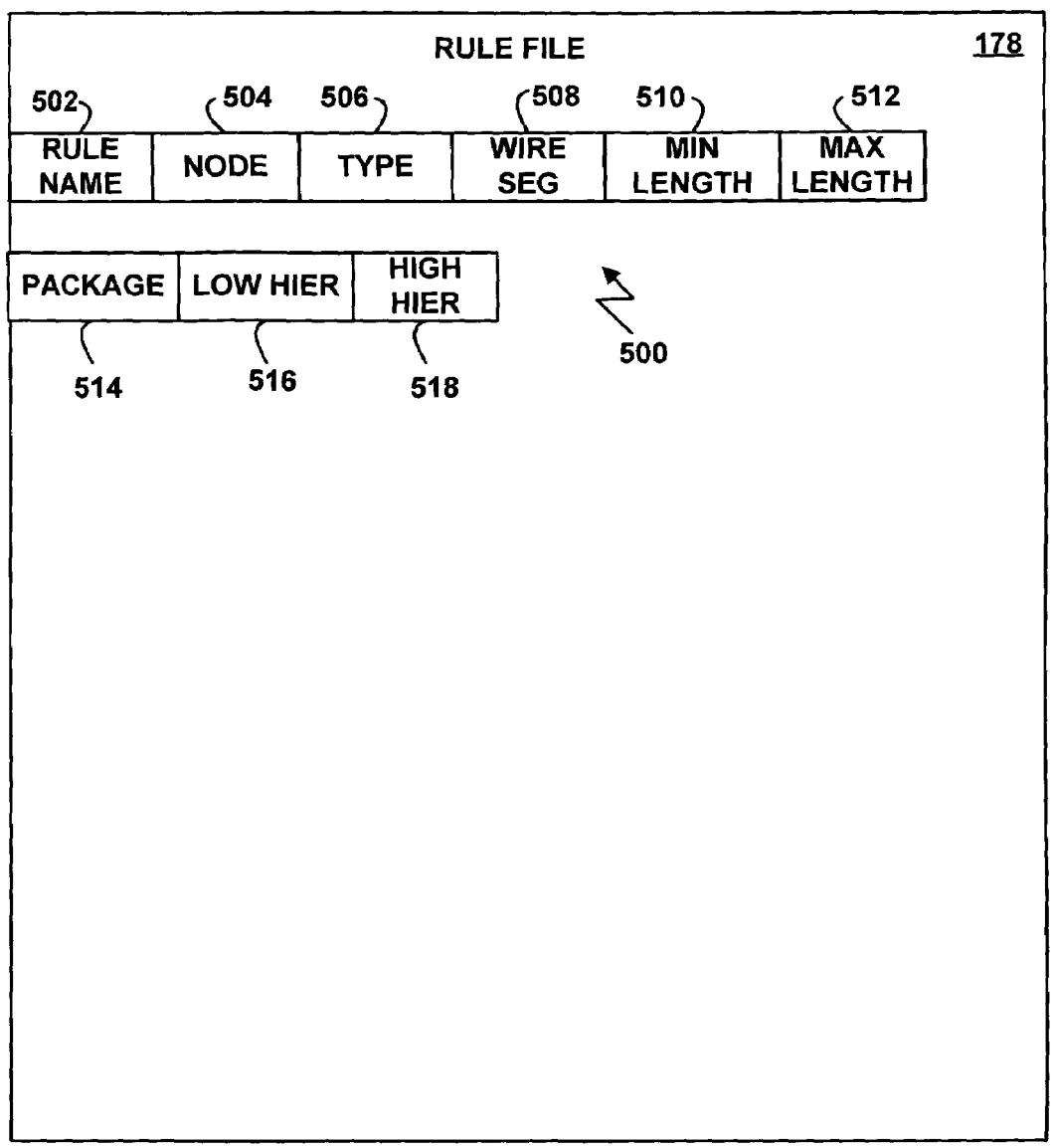
FIG. 5 depicts a high-level block diagram of an example rule file, according to an embodiment of the present invention.

FIG. 5 depicts a high-level block diagram of an example rule file 178, according to an embodiment of the present invention. The rule file 178 includes any number of rules 500, each of which includes some or all of a rule name 502, a node identifier 504, a type 506, a wire segment identifier 508, a minimum length 510, a maximum length 512, a package identifier 514, a low hierarchical 516, a high hierarchical 518, each of which may have any number of records, entries, or values. The rule name 502 identifies the rule 500. The node identifier 504 identifies the nodes 215-1, 215-2, 215-3, 215-4, 215-5, 215-6, 215-7, 215-8, 215-9, 215-10, 215-11, or 215-12. The type 506 indicate a type of the node 504, such as a pin, a via, or a T-connection. The wire segment identifier 508 identifies a wire segment, such as the wire segment 220. The number of the wire segments 508 is one less than the number of the nodes 504. The minimum length 510 indicates the minimum allowed length of the wire segment 508. The maximum length 512 indicates the maximum allowed length of the wire segment 508. The package identifier 514 identifies one of the packages 205-1, 205-2, or 205-3. The high hierarchical 518 indicates the package to which the node 504 is connected. The low hierarchical 516 indicates the package to which the high hierarchical 518 package is connected.

In an embodiment, one the rule files 178 may be a generic rules file that contains a minimum length 510 and a maximum length 512 set to large numbers.

FIG. 6A depicts a high-level block diagram of an example net table 180-1, according to an embodiment of the present invention. The net table 180 (FIG. 1) generically refers to the net table 180-1. The net table 180-1 includes records 402, 404, 406, 408, 410, 412, 414, 416, 418, 420, 422, and 424, each of which includes an node field 426, a reference description field 428, low hierarchy field 430, a high hierarchy field 432, a package field 434, and a type field 436. The node 426 identifies a node in the system configuration 200, such as the 215-1, 215-2, 215-3, 215-4, 215-5, 215-6, 215-7, 215-8, 215-9, 215-10, 215-11, and 215-12. The reference description field 428 indicates text associated with the node 426. The high hierarchy field 432 identifies the package to which the node 426 is connected. The low hierarchy field 430 identifies the package to which the package identified in the high hierarchy field 432 is connected. The package field 434 identifies the package to which the node 426 is connected. The type field 436 indicates the type of the node 426, such as a node implemented by a pin, a node implemented by a via, or a node implemented by a T-connection.

FIG. 6B depicts a high-level block diagram of an example net table 180-2, according to an embodiment of the present invention. The net table 180 (FIG. 1) generically refers to the net table 180-2. The net table 180-2 includes records 449, 450, 452, 454, 456, 458, 460, 462, 464, 466, 468, and 470, each of which includes a wire segment 472, a low hierarchy field 430, a high hierarchy field 432, a minimum length field 433, a package field 434, a net name field 438, and a pin name field 440. The wire segment field 472 identifies a wire segment in the system configuration 200, e.g., the wire segment 220. The high hierarchy field 432 identifies the package to which the node 426 is connected. The high hierarchy field 430 identifies the package to which the low hierarchy package is connected. The package field 434 identifies the package on which the wire segment 472 is located. The net name 438 indicates the name of the wire segment 472. The pin name field 440 indicates a name of the pin to which the wire segment 472 is connected.

Figure 7:
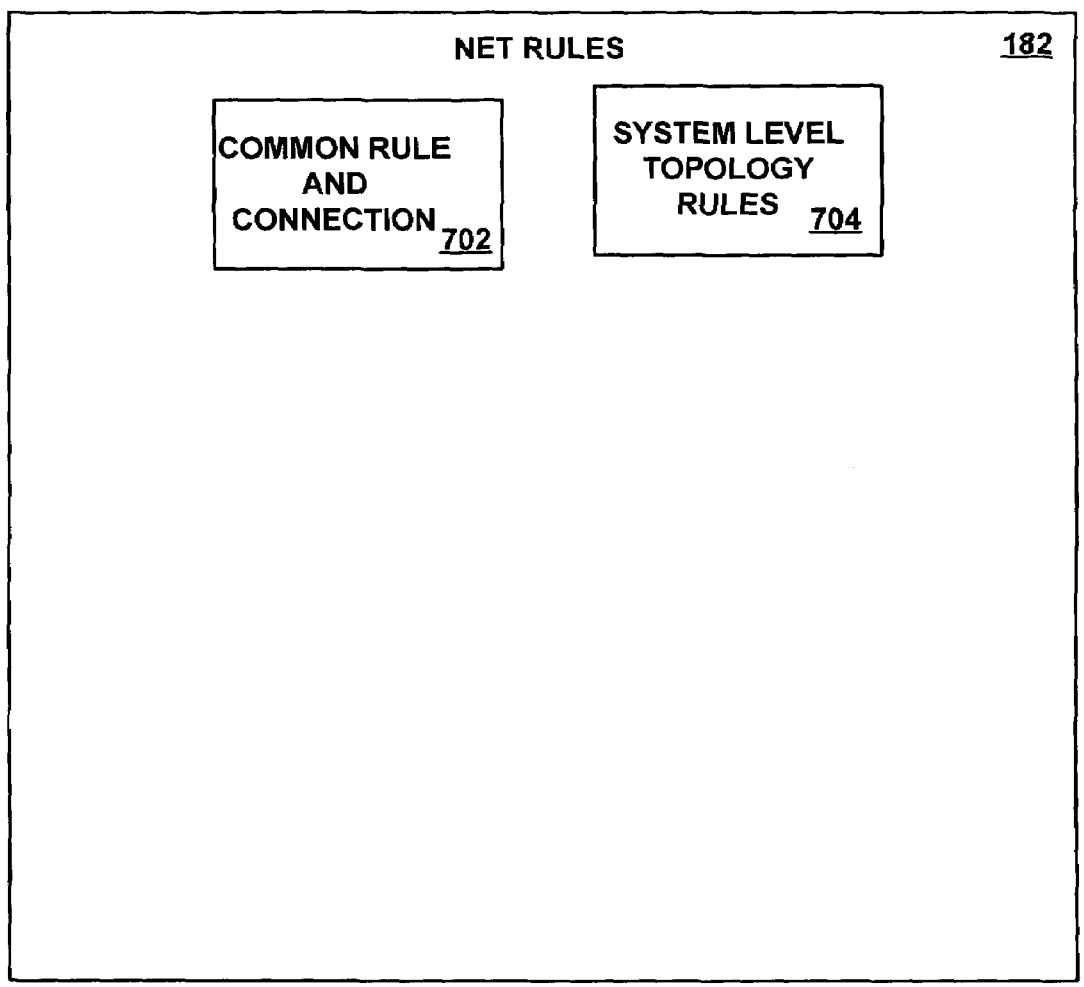
FIG. 7 depicts a high-level block diagram of example net rules, according to an embodiment of the present invention.

FIG. 7 depicts a high-level block diagram of example net rules 182, according to an embodiment of the present invention. The net rules 182 includes a common rule and connection 702 and system level topology rules 704. The common rule and connection 702 enables the reuse of the rule files 178, which allows one package to be used in multiple of the system configurations 200.

Figure 8:
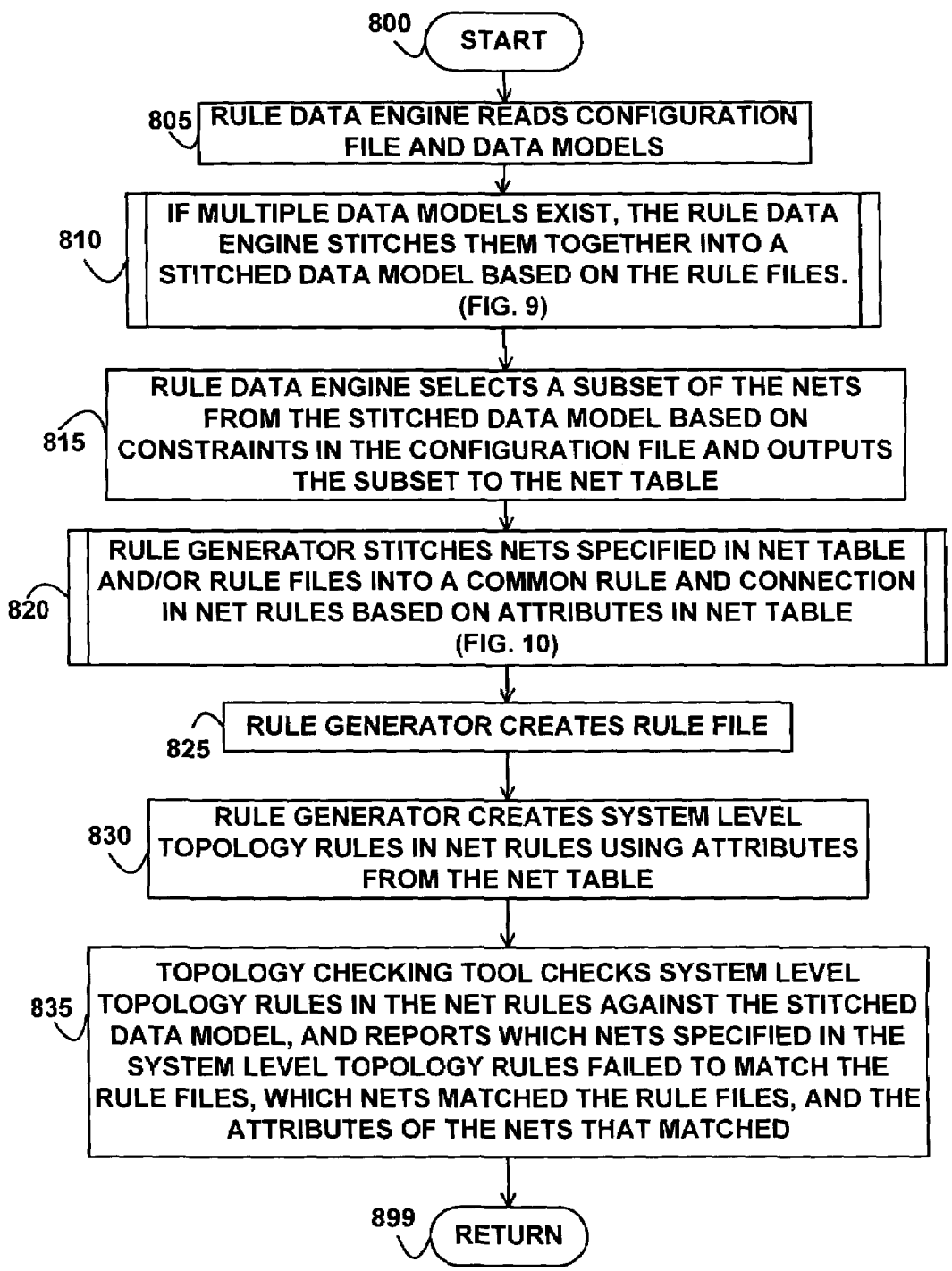
FIG. 8 depicts a high-level flowchart of example processing, according to an embodiment of the present invention.

FIG. 8 depicts a high-level flowchart of example processing, according to an embodiment of the present invention. Control begins at block 800. Control then continues to block 805 where the rule data engine 170 reads the configuration file 174, including the rule file identifier 405, the packages 410, the net identifiers 415, the constraints 420, the formats 445, and the definitions 465. The rule data engine 170 also reads the data model 176, including the vias 305, the T-connections 310, the pins 315, the wire segments 320, and the packages 325.

Control then continues to block 810 where the rule data engine 170 stitches the nets 300 together into a stitched data model if multiple data models exist, as further described below with reference to FIG. 9.

Control then continues to block 815 where the rule data engine 170 formats the net table 180 based on the specified formats 445 and the specified definitions 465, selects a subset of the nets 300 from the stitched data model 176 based on the constraints 420, and outputs the selected subset in the specified format 445 to the net table 180. For example, the rule data engine 170 selects the subset of the nets 300 from the stitched data model 176 that have a length of the wire segment 320 that meets the wire length constraint 420-1, that have a name of the net 300 that meets the name constraint 420-2, that meet the vias constraint 420-3, and/or that meet the T-connections constraint 420-4.

Control then continues to block 820 where the rule generator 172 stitches or combines the nets specified in the net table 180 and/or the rule files 178 into the common rule and connection 702 in the net rules 182, as further described below with reference to FIG. 10.

Control then continues to block 825 where the rule generator 172 creates the rule file 178. The rule generator 172 defines the rule name 502 by the net identifier 415 of the nets 300 to which the rule 500 is to be applied. The rule generator 172 defines the nodes 504 that define each pin or T-connection in the net 300. The rule generator 172 finds the node 504 in the rule file 178 and maps corresponding attributes from the rule file 178 or (old) rule files 178 to each node 504 in the new rule 500. These attributes are now constraint values in the new rule bounding nomenclature, physical, and electrical properties of the net 300. The configuration file 174 can specify net topologies that are to be combined. The rule generator 172 retrieves information from the net table 180 and combines the net topologies to create one system rule 500 in the rule file 178. As an result, the rule generator 172 generates a new set of rules 500 for each net 300, listing constraints and connectivity based on the original net connectivity and ordering results.

Control then continues to block 830 where the rule generator 172 creates system level topology rules 704 in the net rules 182 using attributes from the net table 180.

Control then continues to block 835 where the topology checking tool 184 checks system level topology rules 704 in the net rules 182 against the stitched data model 176 and reports which nets 300 specified in the system level topology rules 704 failed to match the rule files 178, which nets matched the rule files 178, and the attributes of the nets 300 that matched.

Control then continues to block 899 where the logic of FIG. 8 returns.

Figure 9:
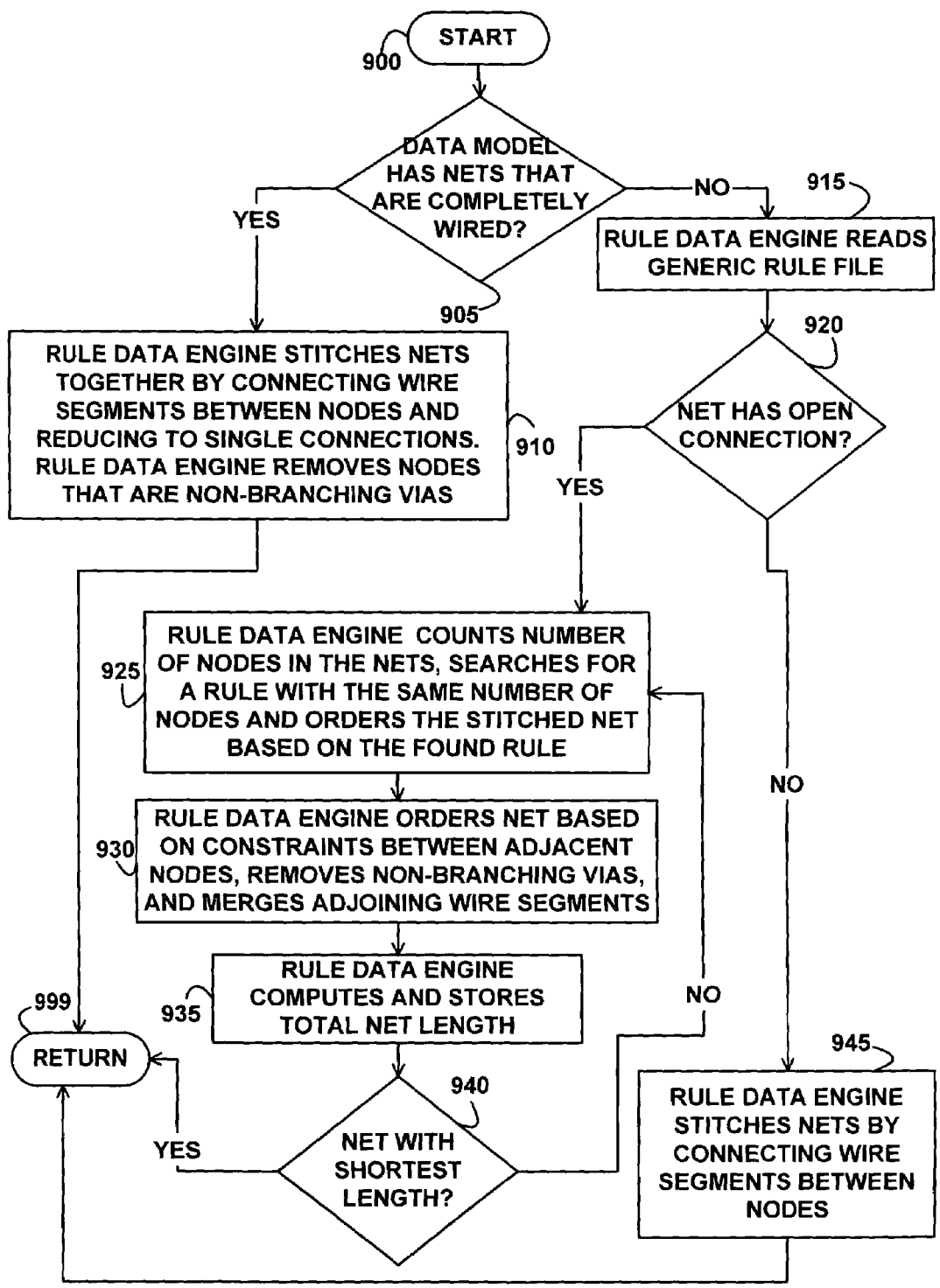
FIG. 9 depicts a high-level flowchart of processing for stitching nets for multiple data models together, according to an embodiment of the invention.

FIG. 9 depicts a high-level flowchart of processing for stitching the nets 300 together for multiple data models 176, according to an embodiment of the invention. Control begins at block 900. Control then continues to block 905 where the rule data engine 170 determines whether the data models 176 have nets 300 that are completely wired. If the determination is true, then the system configuration 200 is completely wired, so control continues to block 910 where the rule data engine 170 stitches the nets 300 together by connecting the wire segments 320 between the nodes 302 and reducing them to single connections. Thus, the rule data engine 170 performs a union of the nodes 302 and the wire segments 320. The rule data engine 170 further removes those nodes 302 that are implemented by vias 305 that are non-branching and merges the adjoining wire segments 320 into a single wire segment in the stitched data model. Non-branching vias 305 have only two wire segments 320 connecting the vias while branching vias 305 may have more than two wire segments 320. Control then continues to block 999 where the logic of FIG. 9 returns.

If the determination at block 905 is false, then the data models 176 include partial or unwired nets, so control continues to block 915 where the rule data engine 170 reads the rule file 178 that is identified by the generic rule file identifier 417 in the configuration file 174. Control then continues to block 920 where the rule data engine 170 determines whether the net 300 has an open connection by determining whether at least one pin 315 does not have a corresponding wire segment 320.

If the determination at block 920 is true, then the net 300 has an open connection, so control continues to block 925 where the rule data engine 170 counts the number of nodes 302 in the nets 300, searches for a rule 500 in the generic rules file 178 that has the same number of nodes, and orders the new stitched system net 300 based on the found rule 500, i.e., the nodes are ordered in the same order as the found rule 500. The rule data engine 170 assigns a rule 500 to each node 302 based on the constraints indicated by the content (the node 504, the type 506, the wire segments 508, the minimum length 510, the maximum length 512, the package 514, the low hierarchy 516, and/or the high hierarchy 518) of the rule 500. If a generic rule file 178 includes a rule 500 with a name of a pin 315 specified, then the rule data engine 170 reverses the order of the nodes 302.

Control then continues to block 930 where the rule data engine 170 orders the net 300 based on the constraints between two adjacent nodes 302, as indicated by the rule file 500. The rule data engine 170 further removes vias 305 that are non-branching (that have only two wire segments 320 connecting to the vias 305) from the net description 300 and merges the adjoining wire segments 320 together.

Control then continues to block 935 where the rule data engine 170 computes and stores the total net length 330 in the data model 176. In another embodiment, the rule data engine 170 calculates the net length 330 based on real wire lengths and Manhattan distances. The Manhattan distance is the distance between two points measured along axes at right angles. The Manhattan distance is also called a rectilinear distance. Thus, in a plane with point $p_1$ at $(x_1, y_1)$ and point $p_2$ at $(x_2, y_2)$, the Manhattan or rectilinear distance between $p_1$ and $p_2 = |x_1-x_2|+|y_1-y_2|$.

Control then continues to block 940 where the rule data engine 170 determines whether a net 300 with the shortest net length 330 has been found. If the determination is true, then control continues to block 999 where the logic of FIG. 9 returns.

If the determination at block 940 is false, then the rule data engine 170 returns to block 925, as previously described above.

If the determination at block 920 is false, then the net 300 does not have an open connection, so control continues to block 945 where the rule data engine 170 stitches the nets 300 in each data model 176 together by connecting the wire segments 320 between the nodes and reducing them to single connections. Control then continues to block 999 where the logic of FIG. 9 returns.

Figure 10:
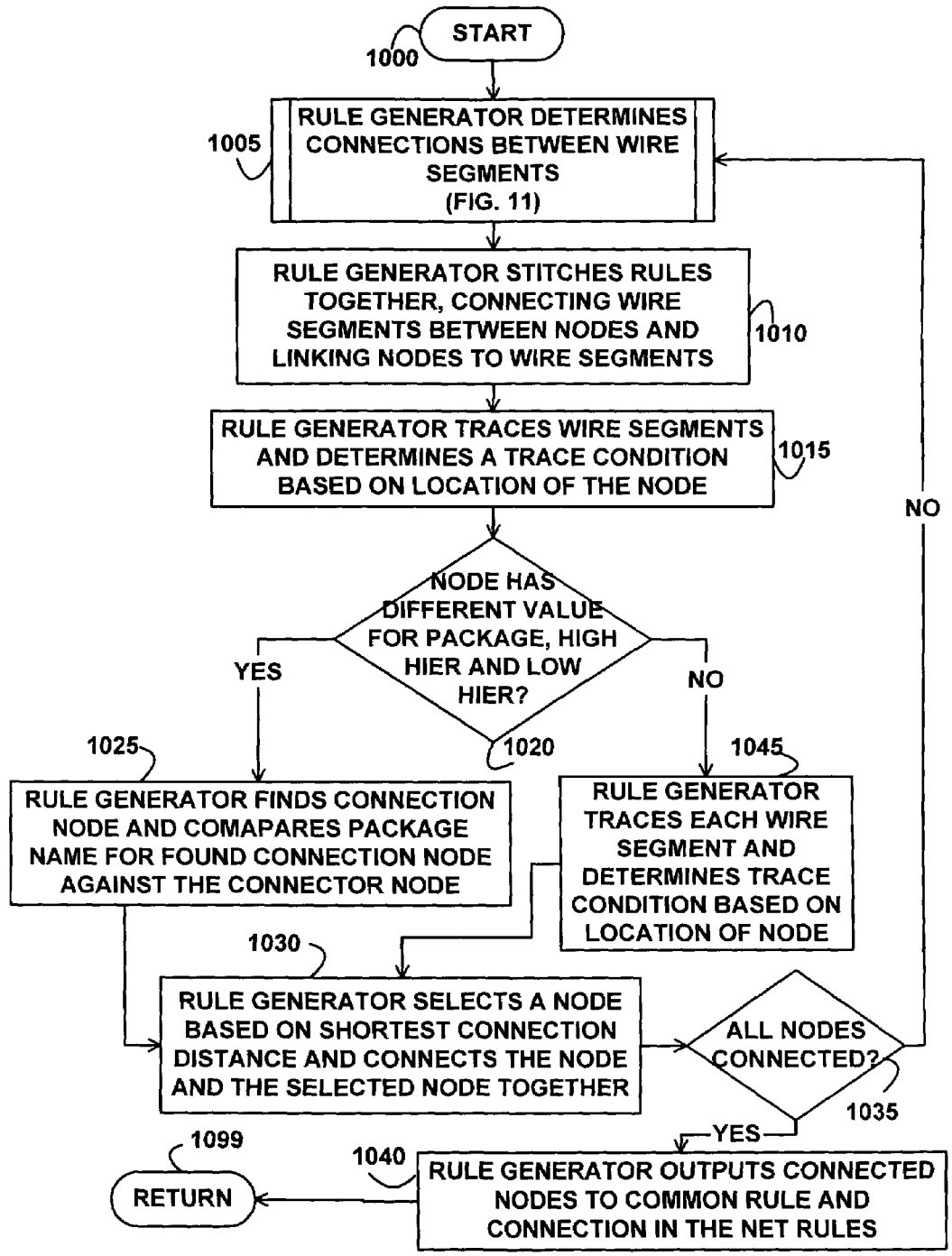
FIG. 10 depicts example processing for stitching nets into a common rule and connection in the net rules, according to an embodiment of the invention.

FIG. 10 depicts example processing for stitching nets into a common rule 702 and connection in the net rules 182. Control begins at block 1000. Control then continues to block 1005 where the rule generator 172 determines the connections to create between the wire segments 508, as further described below with reference to FIG. 11.

Control then continues to block 1010 where the rule generator 172 stitches the rules 500 together, connecting the wire segments 508 between the nodes 504. The rule generator 172 links the nodes 504 to the wire segments 508. The rule generator 172 does not modify the wire segments 508 that are already connected.

Control then continues to block 1015 where the rule generator 172 traces through each wire segment 508, evaluates the nodes 504 to which the wire segment 504 is connected, and determines a trace condition based on the location of the node 504.

Control then continues to block 1020 where the rule generator 172 determines whether the node 504 has a different value for the package 514, the high hierarchical 518, and the low hierarchical 516. If the determination at block 1020 is true, then control continues to block 1025 where the rule generator 172 searches for a connection node 504, and compares the package name 514 for the found connection node 504 against the connector node 504. Control then continues to block 1030 where the rule generator 172 selects a node 504 based on the shortest connection distance. The rule generator 172 connects the node and the selected node together.

Control then continues to block 1035 where the rule generator 172 determines whether all nodes 504 are connected. If the determination at block 1035 is true, then all nodes 504 are connected, so control continues to block 1040 where the rule generator 172 outputs the connected nodes to the common rule and connection 702 in the net rules 182. Control then continues to block 1099 where the logic of FIG. 10 returns.

If the determination at block 1035 is false, then all nodes are not connected, so control returns to block 1005, as previously described above.

If the determination at block 1020 is false, then the node 504 does not has a different value for the package 514, the high hierarchical 518, and the low hierarchical 516, so control continues to block 1045 where the rule generator 172 traces through each wire segment 508, evaluates the nodes 504, and determines the trace condition based on the location of the node 504. If the node 504 is connected to another node 504 on the same package, then the rule generator 172 searches for all nodes 504 that have the same package name. Control then continues to block 1030, as previously described above.

Figure 11:
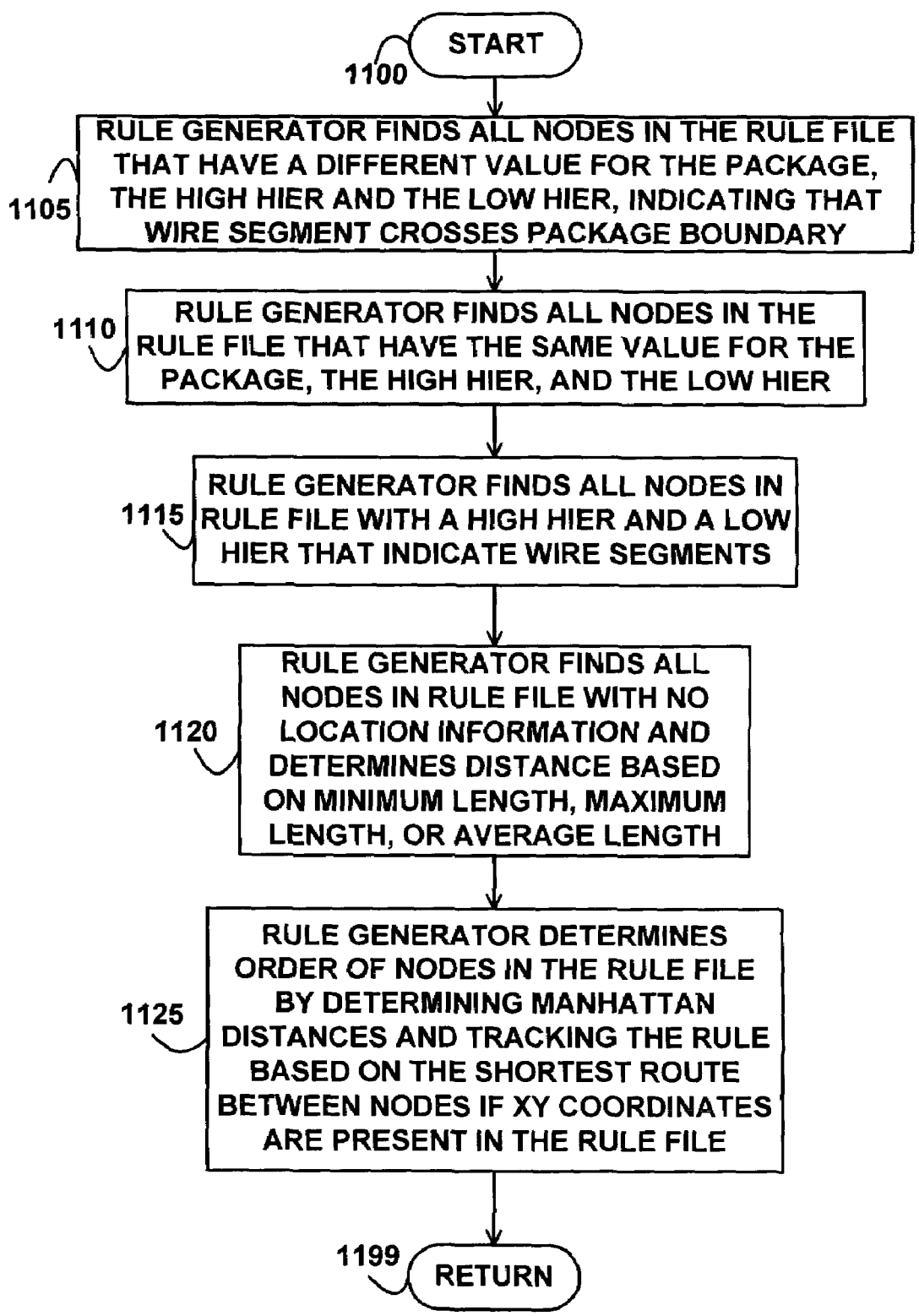
FIG. 11 depicts a high-level block diagram of processing for determining connections between wire segments of the rule file, according to an embodiment of the invention.

FIG. 11 depicts a high-level block diagram of processing for determining connections to create between wire segments 508 of a rule 500, according to an embodiment of the invention. Control begins at block 1100. Control then continues to block 1105 where the rule generator 172 finds all nodes 504 that have a different value for the package 514, the high hierarchical 518, and the low hierarchical 516. Different values indicates that the node 504 connects to another node 504 on another package, i.e., the wire segment 508 that connects the nodes 504 crosses package boundaries.

Control then continues to block 1110 where the rule generator 172 finds all nodes 504 that have the same value for the package 514, the high hierarchical 518, and the low hierarchical 516, which indicates that the found nodes 504 are connected on the same package.

Control then continues to block 1115 where the rule generator 172 finds all of the nodes 504 that have a high hierarchical 518 value and a low hierarchical value 516 that both indicate wire segments, which indicates that the found node 504 is a connector node.

Control then continues to block 1120 where the rule generator 172 finds all of the nodes 504 that do not have location information present in the package 514, the high hierarchical 518, and the low hierarchical 516. The rule generator 172 further determines the distance for the found nodes based on the minimum length 510, the maximum length 512 or the average of the minimum length 510 and the maximum length 512, depending on what information is present in the rule file 178 for each wire segment 508.

Control then continues to block 1125 where the rule generator 172 determines the order for the nodes 504 by calculating Manhattan distances and tracing the rule 500 based on the shortest route between the nodes 504 if xy coordinates are present in the rule 500.

Control then continues to block 1199 where the logic of FIG. 11 returns.

In the previous detailed description of exemplary embodiments of the invention, reference was made to the accompanying Drawings (where like numbers represent like elements), which forms a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention. Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of records, entries, or organizations of data may be used. In addition, any data may be combined with logic, so that a separate data structure is not necessary. The previous detailed description is, therefore, not to be taken in a limiting sense, and the scope of the present invention is defined only by the appended claims.

In the previous description, numerous specific details were set forth to provide a thorough understanding of embodiments of the invention. But, the invention may be practiced without these specific details. In other instances, well-known circuits, structures, and techniques have not been shown in detail in order not to obscure the invention.

We claim:

1. A method comprising:
   stitching a plurality of data models into a stitched data model, wherein each of the plurality of data models comprises a plurality of nets, wherein at least one of the nets crosses a package boundary, wherein the stitching the plurality of data models further comprises determining whether the nets are completely wired and if the determining is true, connecting wire segments between nodes of the nets and removing the nodes from the stitched data model that comprise non-branching vias, wherein the stitching further comprises if the determining is false, deciding whether any of the nets have an open connection and if the deciding is true, finding a rule with a same number of the nodes as the net with the open connection, and ordering the nets based on the rule;
   selecting a subset of the nets from the stitched data model based on a constraint; and
   stitching the subset of the nets into a common rule, wherein the stitching the subset of the nets into a common rule further comprises determining connections between wire segments of rules for the subset of the nets, to connect the wire segments between nodes of the rules, and to link the nodes to the wire segments.

2. The method of claim 1, wherein the selecting further comprises:
   selecting the subset of the nets that have a wire length specified by the constraint.

3. The method of claim 1, wherein the selecting further comprises:
   selecting the subset of the nets that have a name specified by the constraint.

4. The method of claim 1, wherein the selecting further comprises:
   selecting the subset of the nets that have less than a maximum number of vias specified by the constraint.

5. The method of claim 1, wherein the selecting further comprises:
   selecting the subset of the nets that have less than a maximum number of T-connections specified by the constraint.

6. A method for configuring a computer, comprising:
   configuring the computer to stitch a plurality of data models into a stitched data model, wherein each of the plurality of data models comprises a plurality of nets, wherein at least one of the nets crosses a package boundary, wherein the stitching the plurality of data models further comprises determining whether the nets are completely wired, and if the determining is true, connecting wise segments between nodes of the nets, and removing the nodes from the stitched data model that comprise non-branching vias;
   configuring the computer to select a subset of the nets from the stitched data model based on a constraint; and
   configuring the computer to stitch the subset of the nets into a common rule, wherein the configuring the computer to stitch the subset of the nets into a common rule further comprises configuring the computer to determine connections between wire segments of rules for the subset of the nets, to connect the wire segments between nodes of the rules, and to link the nodes to the wire segments.

7. The method of claim 6, wherein the stitching the plurality of data models further comprises:
   configuring the computer to, if the determining is false, decide whether any of the nets have an open connection; and
   configuring the computer to, if the deciding is true, find a rule with a same number of the nodes as the net with the open connection, and order the nets based on the rule.

8. The method of claim 6, wherein the configuring the computer to select further comprises:
   configuring the computer to select the subset of the nets that have a wire length specified by the constraint.

9. The method of claim 6, wherein the configuring the computer to select further comprises:
   configuring the computer to select the subset of the nets that have a name specified by the constraint.

10. The method of claim 6, wherein the configuring the computer to select further comprises:
    configuring the computer to select the subset of the nets that have less than a maximum number of vias specified by the constraint.

11. The method of claim 6, wherein the configuring the computer to select further comprises:
    configuring the computer to select the subset of the nets that have less than a maximum number of T-connections specified by the constraint.

* * * * *